US009329205B2

(12) United States Patent
Lou et al.

(10) Patent No.: US 9,329,205 B2
(45) Date of Patent: May 3, 2016

(54) HIGH-PRECISION SEMICONDUCTOR DEVICE PROBING APPARATUS AND SYSTEM THEREOF

(75) Inventors: Choon Leong Lou, Hsinchu (TW); Ho Yeh Chen, Hsinchu (TW); Hsiao Ting Tseng, Hsinchu (TW)

(73) Assignee: STAR TECHNOLOGIES INC., Hsinchu (TW)

( * ) Notice: Subject to any disclaimer, the term of this patent is extended or adjusted under 35 U.S.C. 154(b) by 885 days.

(21) Appl. No.: 13/425,170

(22) Filed: Mar. 20, 2012

(65) Prior Publication Data

US 2013/0249584 A1    Sep. 26, 2013

(51) Int. Cl.
*G01R 1/067* (2006.01)
*G01R 1/073* (2006.01)
*G01R 31/28* (2006.01)

(52) U.S. Cl.
CPC ........ *G01R 1/07342* (2013.01); *G01R 31/2891* (2013.01); *G01R 1/06727* (2013.01); *G01R 1/07357* (2013.01)

(58) Field of Classification Search
USPC ........................................ 324/755.01–755.11
See application file for complete search history.

(56) References Cited

U.S. PATENT DOCUMENTS

| 5,338,223 | A  | * | 8/1994  | Melatti et al.  | 439/482 |
| 2003/0099097 | A1 | * | 5/2003  | Mok et al.      | 361/767 |
| 2008/0088327 | A1 | * | 4/2008  | Kister          | 324/754 |
| 2008/0252325 | A1 | * | 10/2008 | Kister          | 324/761 |
| 2010/0182013 | A1 | * | 7/2010  | Lou             | 324/555 |

* cited by examiner

*Primary Examiner* — Daniel Miller
(74) *Attorney, Agent, or Firm* — WPAT, P.C., Intellectual Property Attorneys; Anthony King

(57) ABSTRACT

A high precision semiconductor probing system includes a probe head, a circuit board positioned above the probe head, and an optical microscope, wherein the probe head has a plurality of vertical probes and at least one cantilever probe having a vertical body positioned therein. The cantilever probe is disposed close to an edge of the probe head and extends laterally out from the probe head, in order to facilitate the visual alignment viewing from top of the probing apparatus. The optical microscope is positioned on top of the probing apparatus and is configured to have a line of sight directed to the tip of the cantilever probe.

18 Claims, 9 Drawing Sheets

US 9,329,205 B2

HIGH-PRECISION SEMICONDUCTOR DEVICE PROBING APPARATUS AND SYSTEM THEREOF

BACKGROUND OF THE INVENTION

1. Technical Field

The present invention relates to a high-precision semiconductor device probing apparatus, and more particularly, to a vertical probing apparatus with an alignment mechanism which improves the precision of the vertical semiconductor device probing.

2. Background

In semiconductor testing process, a conductivity test is sometimes performed to detect defective products before dicing by bringing conductive probes into contact with testing pads on a semiconductor wafer. When the conductivity test is performed, in order to send a signal to the testing device or to transfer a signal generated by the test, a probing apparatus or a probe card including a large number of probes is used. During the test, a number of probes are brought into contact with a number of dies on the semiconductor wafer while the dies are scanned by the probe card. However, because several hundred to several thousand dies are formed on the semiconductor wafer, considerable time is required to test a single semiconductor wafer.

The vertical probe offers the vertical displacement required by the probe tip to contact the integrated circuit device under test using the deformation of the probe body itself, and can be arranged in a very fine pitch manner. However, an issue arising from the vertical probe is the difficulty in alignment between the probe tip and the testing pads of the integrated circuit. The arrangement of the vertical probes is designed to perform the fine-pitch testing at the expense of precise alignment. Misalignment not only generates inaccurate signals but also damages the semiconductor die if excess pressure is exerted on the testing pad or, even worse, on the die itself.

FIG. 1 illustrates a conventional probing apparatus 10 for testing semiconductor devices. A probe head 11 comprising a plurality of vertical pins is configured to establish electrical connection between a semiconductor device wafer 13 to be tested and a circuit board 12. Each vertical probe has a tip end 15 for contacting a testing pad on the semiconductor device wafer 13, and a connector end 14 for contacting the circuit board 12. The circuit board 12 acts as an interface to transfer a signal to and from the semiconductor device wafer 13. As shown in FIG. 1, the probe head 11 shadows all the vertical pins carried within, rendering the alignment between the tip end 15 of the vertical pins and the corresponding testing pads on the semiconductor device wafer 13 difficult, assuming the alignment is carried out from the top of the conventional probing apparatus, such as using an optical microscope observing thorough an open structure.

Because the density of modern integrated circuits continues to increase consistently, a probing apparatus equipped with a fine-pitch testing structure but with a mechanism contributing to high precision alignment is crucial in today's semiconductor testing technology.

SUMMARY

One aspect of the present invention provides a semiconductor probing apparatus having a probe head. In one embodiment of the present invention, the probe head comprises a plurality of vertical probes positioned in the probe head, with a tip end downwardly protruding from a second surface of the probe head, and a first connector end upwardly protruding from a first surface of the probe head; and at least one cantilever probe having a vertical body positioned in the probe head, with a skewed cantilever end protruding from the second surface, and a second connector end upwardly protruding from the first surface. In one embodiment of the present invention, the cantilever probe is disposed close to an edge of the probe head and extends laterally out from the probe head, in order to facilitate the visual alignment viewing from top of the probing apparatus.

Another aspect of the present invention provides a semiconductor probing system comprising a probe head, a circuit board positioned above the probe head, and an optical microscope. In one embodiment of the present invention, the probe head comprises a plurality of vertical probes positioned therein, with a tip end downwardly protruding from a second surface of the probe head, and a first connector end upwardly protruding from a first surface of the probe head; and at least one cantilever probe having a vertical body positioned therein, with a skewed cantilever end protruding from the second surface, and a second connector end upwardly protruding from the first surface. In one embodiment of the present invention, the cantilever probe is disposed close to an edge of the probe head and extends laterally out from the probe head, in order to facilitate the visual alignment viewing from top of the probing apparatus. In one embodiment of the present invention, the optical microscope is positioned on top of the probing apparatus and configured to have a line of sight directed to the tip of the cantilever probe.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION

Figure 1:
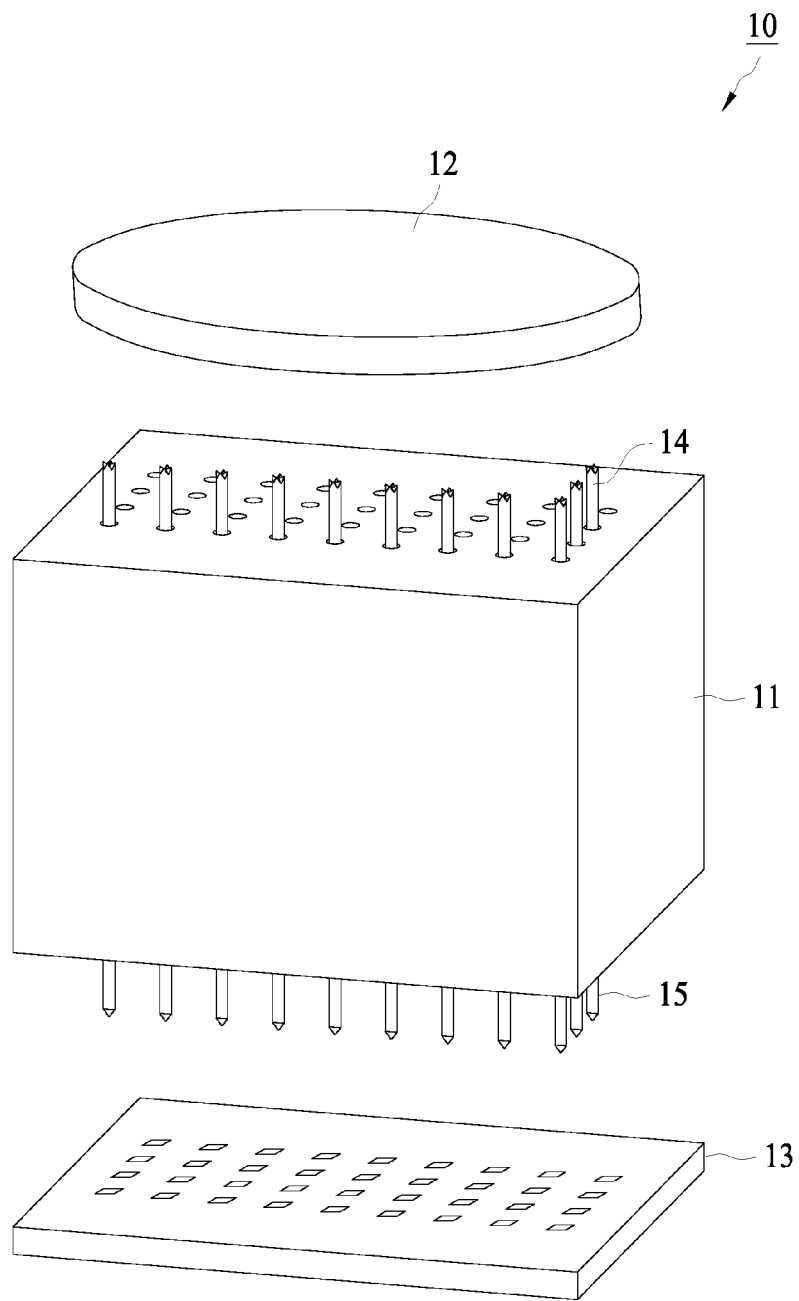
FIG. 1 illustrates a conventional semiconductor probing apparatus for testing semiconductor devices.
Figure 2:
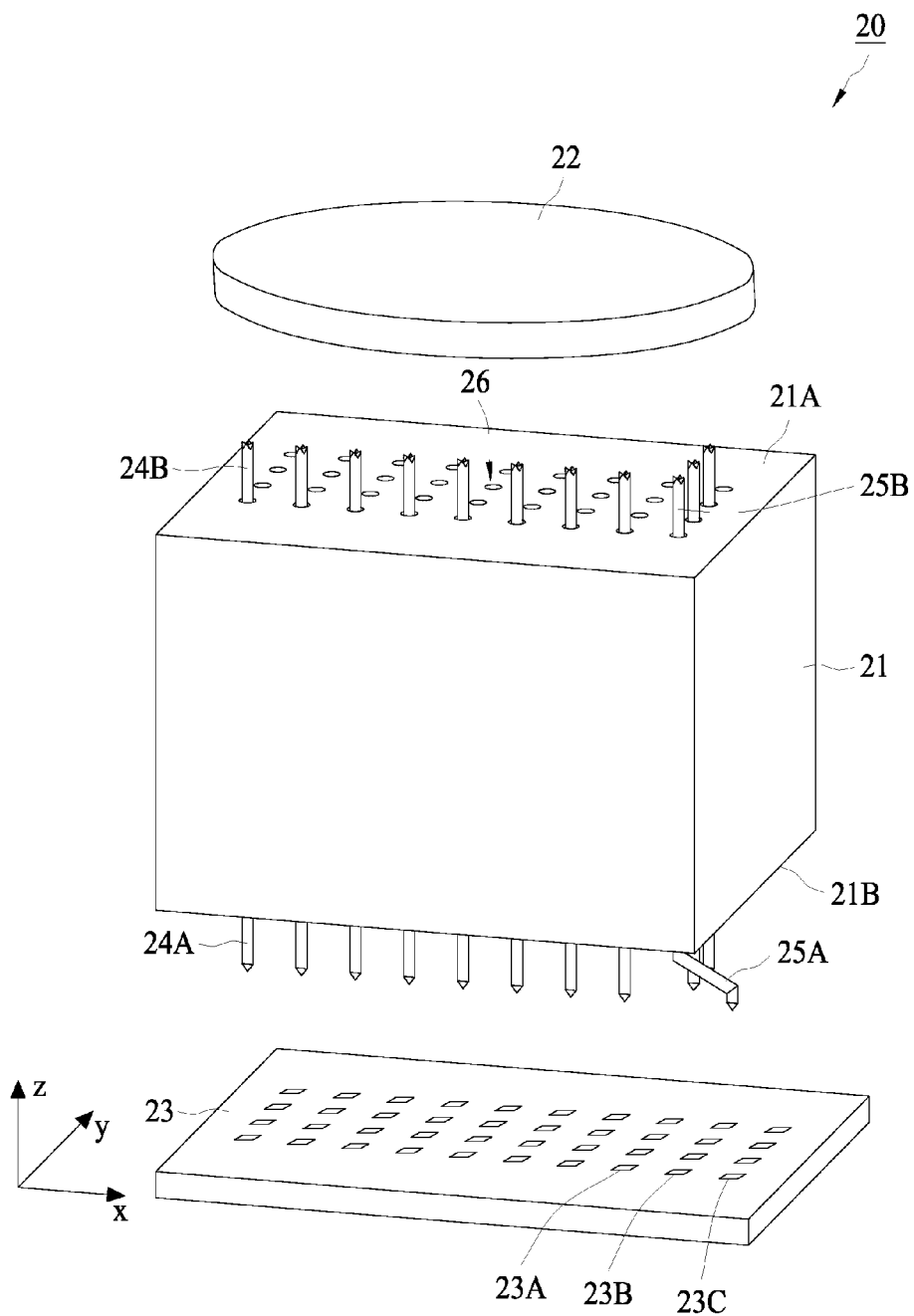
FIG. 2 illustrates a semiconductor probing apparatus for testing semiconductor devices according to an embodiment of the present invention.

FIG. 2 illustrates a high-precision semiconductor probing apparatus 20 according to one embodiment of the present invention. A probe head 21 having a first surface 21A and a second surface 21B comprises a plurality of vertical pins to establish an electrical connection between a semiconductor device wafer 23 and a circuit board 22. Each vertical probe has a tip end 24A for contacting a testing pad on the semiconductor device wafer 23, and a first connector end 24B for contacting the circuit board 22. The circuit board 22 acts as an interface to transfer signal to and from the semiconductor device wafer 23. In addition to the plurality of vertical probes carried by the probe head 21, a cantilever probe having a skewed cantilever end 25A and a second connector end 25B is positioned close to an edge of the probe head, extending laterally out from the probe head 21.

Viewing from the top of the probing apparatus 20, a person operating the apparatus is able to form a line of sight directed to the cantilever end 25A, the view of which is not blocked by the probe head. As opposed to other vertical probes in the probe head 21, the cantilever probe can be used as an alignment mechanism, that is, when the semiconductor device wafer 23 approaches the probe head 21 along the positive z direction, the relative position between the cantilever end 25A and the testing pads can be adjusted on the x-y plane through the position adjustment of the semiconductor device wafer 23 itself. Because the distance between the cantilever probe and the vertical probe is predetermined, when the cantilever end 25A is brought into contact with the testing pad 23C, the first vertical probe to the negative x direction of the cantilever probe is guaranteed to be in contact with the corresponding testing pad 23A, and the same condition applies to other vertical probes. In the present embodiment, only the testing pad 23B is not subjected to contact by any testing probe.

Figure 3:
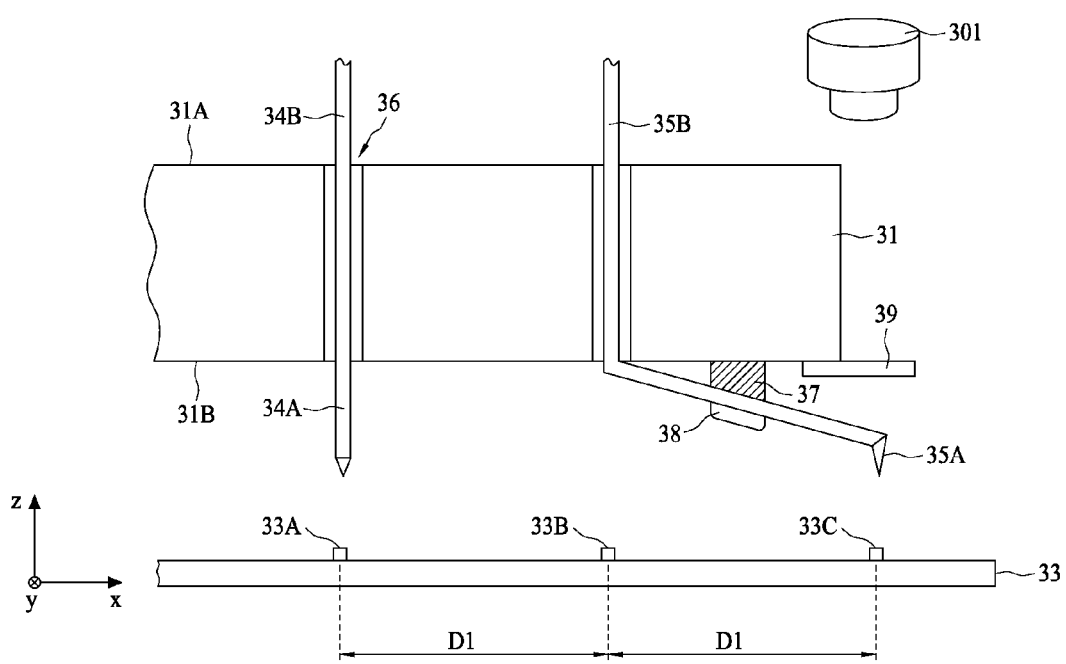
FIG. 3 illustrates a local cross-sectional view of the high-precision probing apparatus for testing semiconductor devices according to another embodiment of the present invention.

FIG. 3 illustrates a local cross-sectional view of the high-precision probing apparatus for testing semiconductor devices according to another embodiment of the present invention. A probe head 31 having a first surface 31A and a second surface 31B comprises a plurality of vertical pins (only one of which is shown) positioned in the through hole 36. The vertical pin establishes an electrical connection between a semiconductor device wafer 33 and a circuit board (not shown). Each vertical probe has a tip end 34A for contacting a testing pad on the semiconductor device wafer 33, and a first connector end 34B for contacting the circuit board (not shown). In addition to the plurality of vertical probes carried by the probe head 31, a cantilever probe having a skewed cantilever end 35A and a second connector end 35B is positioned close to an edge of the probe head 31, extending laterally out from the probe head 31.

A supporter 37 is disposed on the second surface 31B of the probe head 31, and the cantilever probe is attached to the supporter 37 by an epoxy 38. A transparent cover 39 is disposed on the second surface 31B of the probe head 31, with a length substantially greater than that of the portion of the cantilever probe extending out from the shadowing area of the probe head 31. The transparent cover 39 provides additional protection to the fragile cantilever tip, which is prone to damage from impact during operation. The installation of the transparent cover 39 allows the alignment viewing from top of the probing apparatus.

As shown in FIG. 3, an optical microscope 301 together with the probing apparatus forms a high precision probing system. The optical microscope 301 is positioned to have a line of sight directed to the tip of the cantilever probe. Viewing from the top of the probing apparatus, a person operating the probing apparatus is able to monitor the cantilever end 35A, the view of which is not blocked by the probe head 31. As opposed to other vertical probes in the probe head 31, the cantilever probe can be used as an alignment mechanism, that is, when the semiconductor device wafer 33 approaches the probe head 31 along the positive z direction, the relative position between the cantilever end 35A and the testing pads can be adjusted on the x-y plane through the position adjustment of the semiconductor device wafer 33 itself. Because the distance between the cantilever probe and the vertical probe, 2D1, is predetermined, wherein D1 is the distance between two adjacent testing pads, when the cantilever end 35A is brought into contact with the testing pad 33C, the first vertical probe to the negative x direction of the cantilever probe is guaranteed to be in contact with the corresponding testing pad 33A, and the same condition applies to other vertical probes. In the embodiment shown in FIG. 3, only the first row of probes is depicted. However, when taking the depth along positive y direction into account, a plurality of cantilever probes are aligned behind the first cantilever probe; therefore, only the column containing testing pad 33B is not contacted by any probes.

Figure 4:
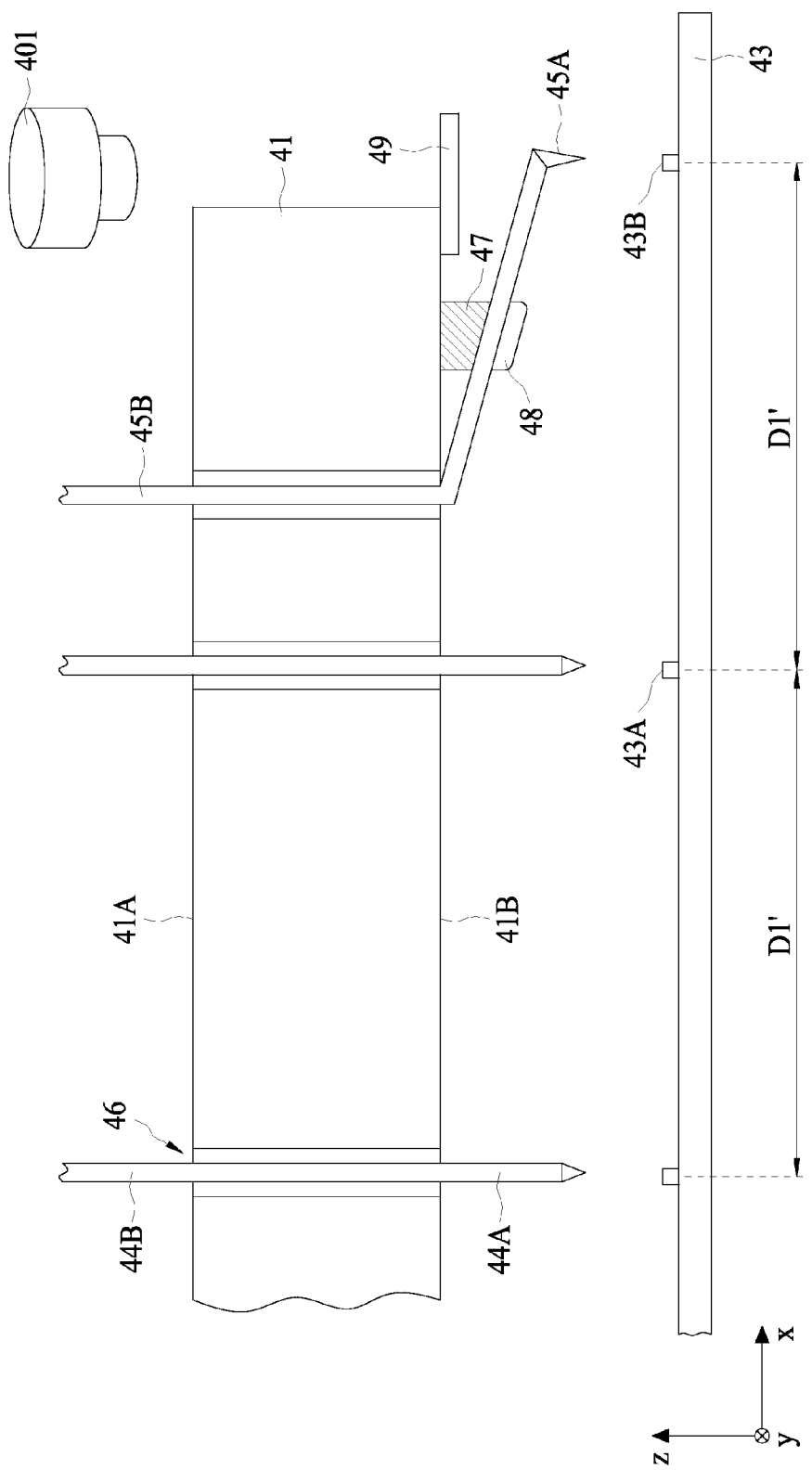
FIG. 4 illustrates a local cross-sectional view of the semiconductor probing apparatus for testing semiconductor devices according to another embodiment of the present invention.

FIG. 4 illustrates a local cross-sectional view of the high-precision probing apparatus for testing semiconductor devices according to another embodiment of the present invention. A probe head 41 having a first surface 41A and a second surface 41B comprises a plurality of vertical pins (only two of which are shown) positioned in the through holes 46. The vertical pin establishes an electrical connection between a semiconductor device wafer 43 and a circuit board (not shown). Each vertical probe has a tip end 44A for contacting a testing pad on the semiconductor device wafer 43, and a first connector end 44B for contacting the circuit board (not shown). In addition to the plurality of vertical probes carried by the probe head 41, a cantilever probe having a skewed cantilever end 45A and a second connector end 45B is positioned close to an edge of the probe head, extending laterally out from the probe head 41.

A supporter 47 is disposed on the second surface 41B of the probe head 41, and the cantilever probe is attached to the supporter 47 by an epoxy 48. A transparent cover 49 is disposed on the second surface 41B of the probe head 41, with a length substantially greater than that of the portion of the cantilever probe extending out from the shadowing area of the probe head 41. The transparent cover 49 provides additional protection to the fragile cantilever tip, which is prone to damage from impact during operation. The installation of the transparent cover 49 allows the alignment viewing from top of the probing apparatus.

As shown in FIG. 4, an optical microscope 401 together with the probing apparatus forms a high precision probing system. The optical microscope 401 is positioned to have a line of sight directed to the tip of the cantilever probe. Viewing from the top of the probing apparatus, a person operating the probing apparatus is able to monitor the cantilever end 45A, the view of which is not blocked by the probe head 41. As opposed to other vertical probes in the probe head 41, the cantilever probe can be used as an alignment mechanism; that is, when the semiconductor device wafer 43 approaches the probe head 41 along the positive z direction, the relative position between the cantilever end 45A and the testing pads can be adjusted on the x-y plane through the position adjustment of the semiconductor device wafer 43 itself. Because the distance between the cantilever probe and the vertical probe, D1', is predetermined, wherein D1' is the distance between two adjacent testing pads, when the cantilever end 45A is brought into contact with the testing pad 43B, the first vertical probe to the negative x direction of the cantilever probe is guaranteed to be in contact with the corresponding testing pad 43A, and the same condition applies to other vertical probes. In the embodiment shown in FIG. 4, only the first row of the probes is depicted. However, when taking the depth along positive y direction into account, a plurality of cantilever probes are aligned behind the first cantilever probe; therefore, each testing pad on the semiconductor device wafer 43 is subjected to contact by a corresponding probe.

Figure 5:
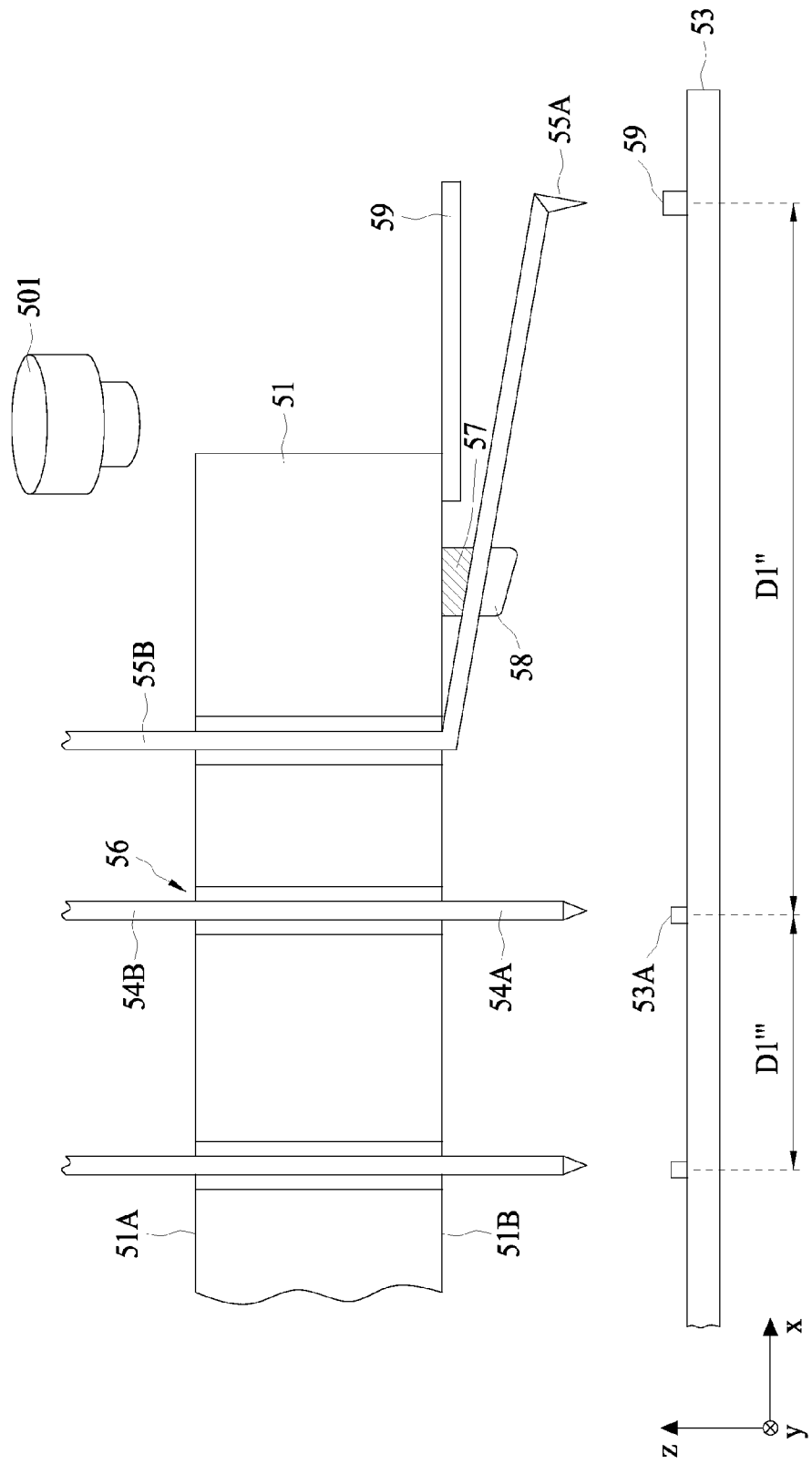
FIG. 5 illustrates a local cross-sectional view of the semiconductor probing apparatus for testing semiconductor devices according to another embodiment of the present invention.

FIG. 5 illustrates a local cross-sectional view of the high-precision probing apparatus for testing semiconductor devices according to another embodiment of the present invention. A probe head 51 having a first surface 51A and a second surface 51B comprises a plurality of vertical pins (only two of which are shown) positioned in the through holes 56. The vertical pin establishes an electrical connection between a semiconductor device wafer 53 and a circuit board (not shown). Each vertical probe has a tip end 54A for contacting a testing pad on the semiconductor device wafer 53, and a first connector end 54B for contacting the circuit board (not shown). In addition to the plurality of vertical probes carried by the probe head 51, a cantilever probe having a skewed cantilever end 55A and a second connector end 55B is positioned close to an edge of the probe head, extending laterally out from the probe head 51.

A supporter 57 is disposed on the second surface 51B of the probe head 51, and the cantilever probe is attached to the supporter 57 by an epoxy 58. A transparent cover 59 is disposed on the second surface 51B of the probe head 51, with a length substantially greater than that of the portion of the cantilever probe extending out from the shadowing area of the probe head 51. The transparent cover 59 provides additional protection to the fragile cantilever tip, which is prone to damage from impact during operation. The installation of the transparent cover 59 allows the alignment viewing from top of the probing apparatus.

As shown in FIG. 5, an optical microscope 501 together with the probing apparatus forms a high precision probing system. The optical microscope 501 is positioned to have a line of sight directed to the tip of the cantilever probe. Viewing from the top of the probing apparatus, a person operating the probing apparatus is able to monitor the cantilever end 55A, the view of which is not blocked by the probe head 51. As opposed to other vertical probes in the probe head 51, the cantilever probe can be used as an alignment mechanism, that is, when the semiconductor device wafer 53 approaches the probe head 51 along the positive z direction, the relative position between the cantilever end 55A and the testing pads can be adjusted on the x-y plane through the position adjustment of the semiconductor device wafer 53 itself. The cantilever probe is aligned to an alignment mark 59 close to an edge of the semiconductor device wafer 53, and the distance D1" between the cantilever tip 55A and the first vertical tip to the negative x direction is not an integer multiple of the distance D1''' between two adjacent testing pads.

In the embodiment shown in FIG. 5, only the first row of probes is depicted. However, when taking the depth along positive y direction into account, a plurality of cantilever probes are aligned behind the first cantilever probe; therefore, each testing pad and each alignment mark on the semiconductor device wafer 53 are subjected to contact by a corresponding probe.

Figure 6:
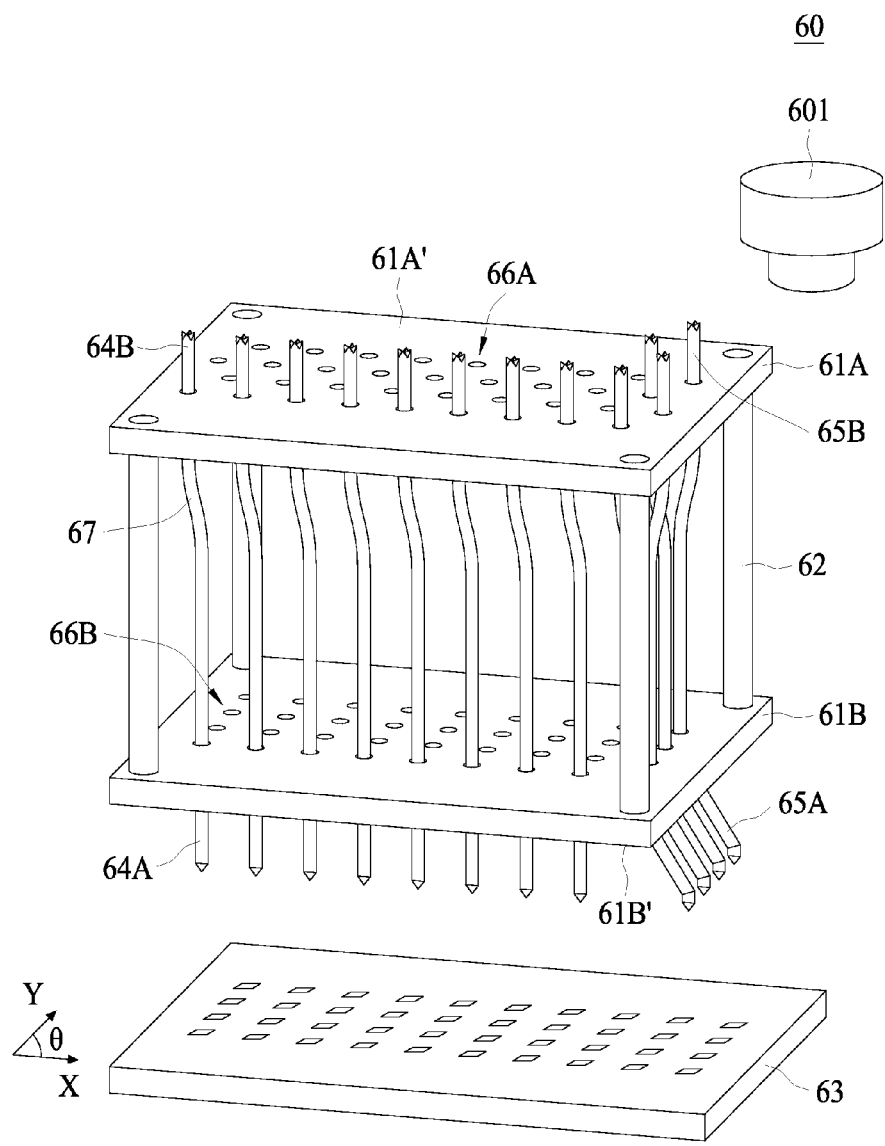
FIG. 6 illustrates a semiconductor probing system for testing semiconductor devices according to another embodiment of the present invention.

FIG. 6 illustrates a high-precision probing system 60 for testing semiconductor devices according to another embodiment of the present invention. The probe head now comprises an upper guiding plate 61A having a plurality of upper guiding holes 66A and a first surface 61A', and a bottom guiding plate 61B having a plurality of bottom guiding holes 66B and a second surface 61B'. A plurality of vertical probes is positioned between the upper guiding holes 66A and the bottom guiding holes 66B. The vertical probe shown in FIG. 6 includes a tip end 64A configured to contact the testing pad on the semiconductor device wafer 63; a first connector end 64B configured to contact a circuit board (not shown); and a buckling section 67 configured to release the stress generated as the probe contacts the device under test. Frequent bending of the vertical probe is likely to generate metal fatigue and shorten the service life of the vertical probe. Therefore, a design departing from a vertical rigid body is necessary to enhance the durability of the probe.

The probe head also includes four cantilever probes positioned at an edge of the upper and bottom guiding plates, between the upper guiding holes 66A and the bottom guiding holes 66B. Each cantilever probe has a vertical body with a second connector end 65B, and a cantilever part with a skewed cantilever end 65A. An optical microscope 601 is positioned to have a line of sight directed to the cantilever end 65A. An alignment process using a column of cantilever probes can ensure that the probe head is squarely aligned with the semiconductor device wafer 63 without any rotation in the θ direction.

Figure 7:
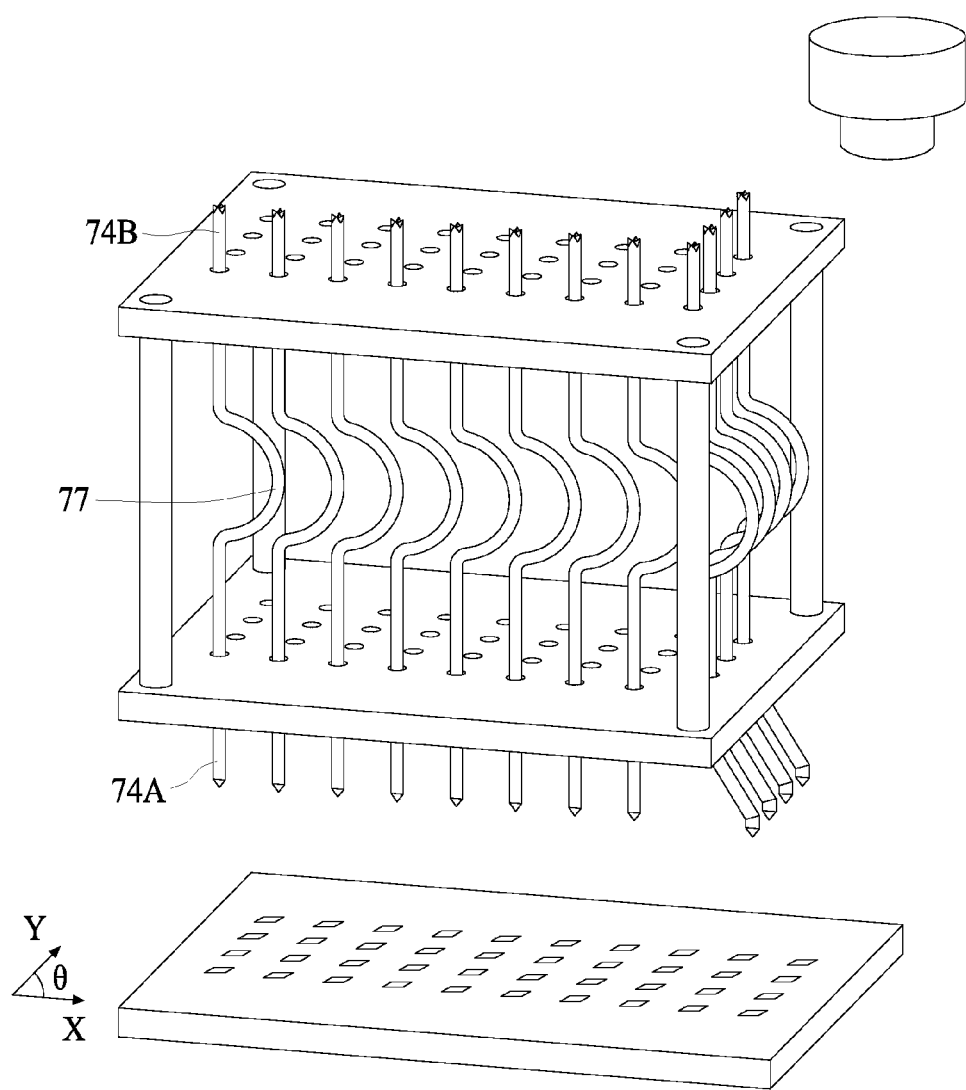
FIG. 7 illustrates a semiconductor probing system for testing semiconductor devices according to another embodiment of the present invention.

FIG. 7 illustrates a high-precision probing system 70 for testing semiconductor devices according to another embodiment of the present invention. In the present embodiment, the detail of the probe head can refer to the embodiment described in FIG. 6. The vertical probe shown in FIG. 7 includes a tip end 74A, a first connector end 74B, and a spring section 77 configured to release the stress generated as the probe contacts the device under test. Frequent bending of the vertical probe is likely to generate metal fatigue and shorten the service life of the vertical probe. Therefore, a design departing from a vertical rigid body is necessary to enhance the durability of the probe.

Figure 8:
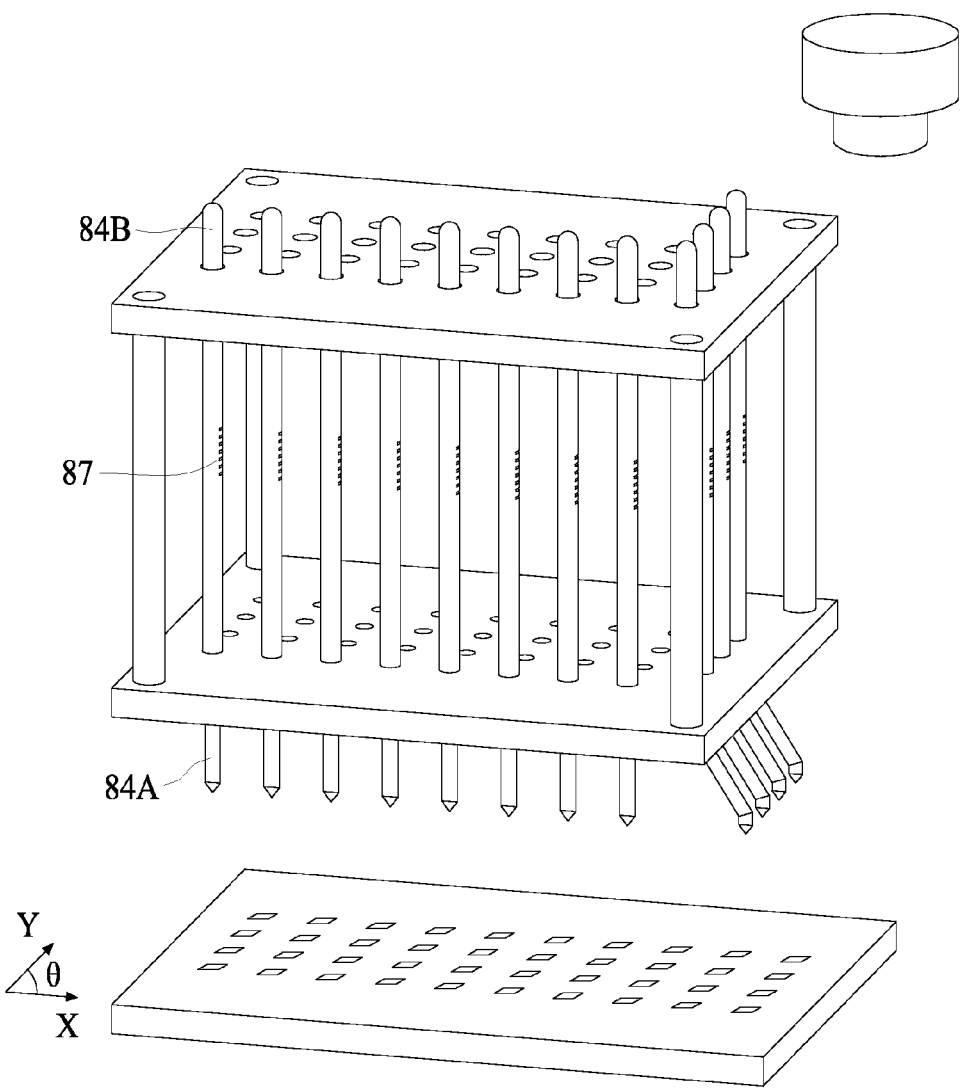
FIG. 8 illustrates a semiconductor probing system for testing semiconductor devices according to another embodiment of the present invention.

FIG. 8 illustrates a high-precision probing system 80 for testing semiconductor devices according to another embodiment of the present invention. In the present embodiment, the detail of the probe head can be understood by referring to the embodiment described in FIG. 6. The vertical probe shown in FIG. 8 includes a tip end 84A, a first connector end 84B, and a slot section 87 configured to release the stress generated as the probe contacts the device under test. The slot section 87 on the vertical probe comprises at least one slot or groove along the azimuth direction on the linear body of the vertical probe. Frequent bending of the vertical probe is likely to generate metal fatigue and shorten the service life of the vertical probe. Therefore, a design departing from a vertical rigid body is necessary to enhance the durability of the probe.

Figure 9:
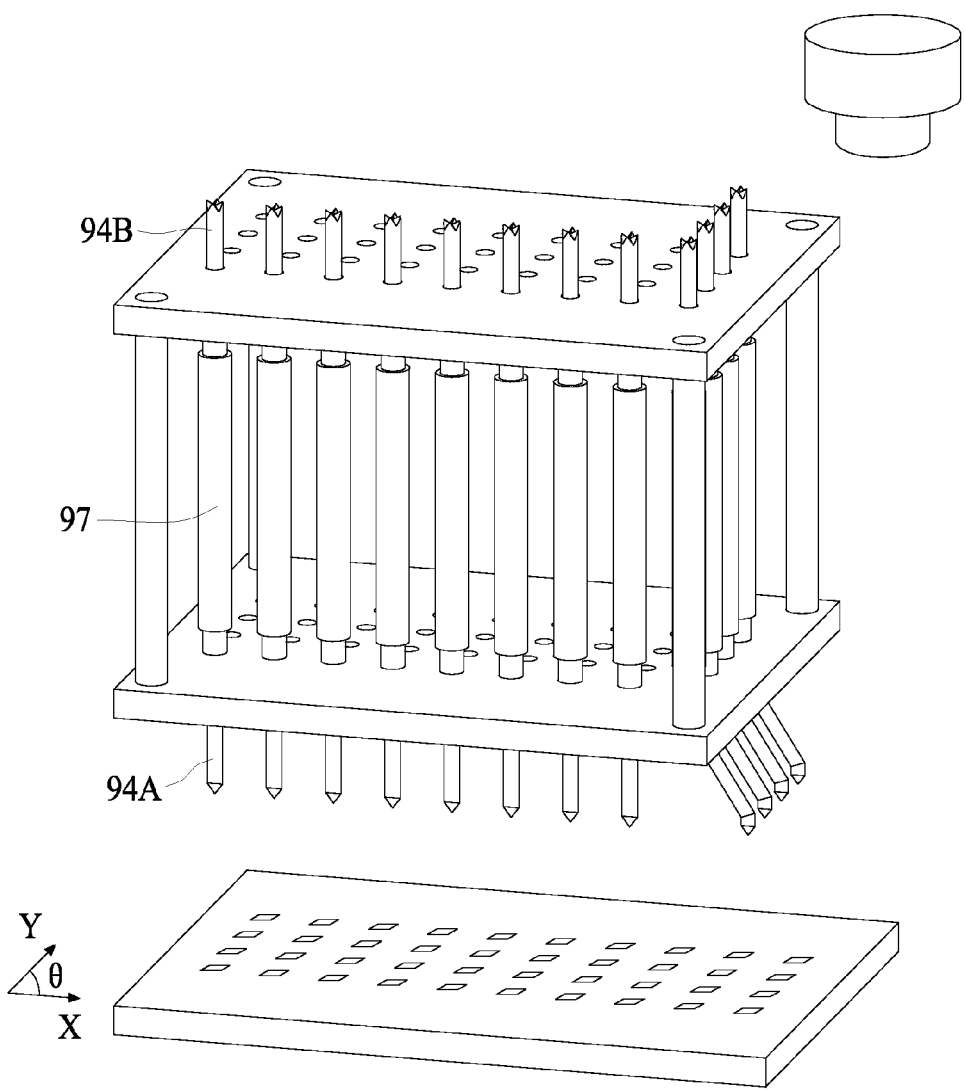
FIG. 9 illustrates a semiconductor probing system for testing semiconductor devices according to another embodiment of the present invention.

FIG. 9 illustrates a high-precision probing system 90 for testing semiconductor devices according to another embodiment of the present invention. In the present embodiment, the detail of the probe head can be understood by referring to the embodiment described in FIG. 6. The vertical probe shown in FIG. 9 includes a tip end 94A, a first connector end 94B, and an elastic section 97 configured to release the stress generated as the probe contact the device under test. The elastic section 97 on the vertical probe includes a cylindrical housing, wherein a spring with two ends is positioned in the housing. One end of the spring is subjected to a connecting pin, and the other end of the spring is subjected to a testing pin. For example, a POGO pin can be used as an elastic vertical pin. Frequent bending of the vertical probe is likely to generate metal fatigue and shorten the service life of the vertical probe. Therefore, a design departing from a vertical rigid body is necessary to enhance the durability of the probe.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor probing apparatus, comprising:
    a probe head, comprising:
        a probe carrier, comprising a first surface, a second surface opposite to the first surface, and a plurality of guiding holes penetrating the first surface and the second surface;
        a plurality of vertical probes, each positioned in one of the plurality of the guiding holes, wherein each vertical probe comprises a tip end downwardly protruding from the second surface and a first connector end upwardly protruding from the first surface; and
        at least one cantilever probe having a vertical body positioned in one of the plurality of the guiding holes, wherein the at least one cantilever probe comprises a skewed cantilever end protruding from the second surface and a second connector end upwardly protruding from the first surface;
        wherein the cantilever probe is disposed adjacent to an exterior edge of the probe carrier and the skewed cantilever end extends laterally out from the exterior edge of the probe carrier to make the skewed cantilever end viewable from the first surface of the probe carrier along a line of sight normal to the first surface of the probe carrier.

2. The semiconductor probing apparatus of claim 1, further comprising a supporter disposed on the second surface of the probe head, wherein the skewed cantilever end is affixed to the supporter by an epoxy resin.

3. The semiconductor probing apparatus of claim 1, further comprising a transparent cover disposed on the second surface of the probe head, extending laterally out from the probe head, and substantially covering the underlying cantilever probe.

4. The semiconductor probing apparatus of claim 1, wherein a shortest lateral distance between the cantilever probe and the vertical probe is fixed and the distance corresponds to the lateral distance between two testing pads of a patterned wafer being tested.

5. The semiconductor probing apparatus of claim 4, wherein the distance between two testing pads of a patterned wafer comprises an integer multiple of the distance between two adjacent testing pads.

6. The semiconductor probing apparatus of claim 1, wherein a shortest lateral distance between the cantilever probe and the vertical probe corresponds to the lateral distance between a testing pad and an alignment mark of a patterned wafer being tested.

7. The semiconductor probing apparatus of claim 1, wherein the vertical distance between the second surface of the probe head and the tip of the cantilever probe is equal to or greater than the vertical distance between the second surface of the probe head and the tip of the vertical probe.

8. The semiconductor probing apparatus of claim 1, wherein the vertical probes are selected from the group consisting of a pin with a buckling section, a pin with a spring section, a pin with at least one slot, a POGO pin, and the combination thereof.

9. The semiconductor probing apparatus of claim 1, wherein the probe head comprises an upper guiding plate having a plurality of upper guiding holes and a bottom guiding plate having a plurality of bottom guiding holes, wherein the plurality of vertical probes and the at least one cantilever probe are disposed between the upper guiding holes of the upper guiding plate and the bottom guiding holes of the bottom guiding plate.

10. A semiconductor probing system, comprising:
    a probe head, comprising:
        a probe carrier, comprising a first surface, a second surface opposite to the first surface, and a plurality of guiding holes penetrating the first surface and the second surface;
        a plurality of vertical, each probes positioned in one of the plurality of the guiding holes, wherein each vertical probe comprises a tip end downwardly protruding from the second surface and a first connector end upwardly protruding from the first surface; and
        at least one cantilever probe having a vertical body positioned in one of the plurality of guiding holes, wherein the at least one cantilever probe comprises a skewed cantilever end protruding from the second surface and a second connector end upwardly protruding from the first surface;
        wherein the cantilever probe is disposed adjacent to an exterior edge of the probe carrier and the skewed cantilever end extends laterally out from the exterior edge of the probe carrier to make the skewed cantilever end viewable from the first surface of the probe carrier along a line of sight normal to the first surface of the probe carrier;
    a circuit board positioned above the first surface of the probe head and electrically connected to the connector end of the vertical probes and the connector end of the cantilever probe; and
        an optical microscope configured to have a line of sight directed to the skewed cantilever end of the cantilever probe from the top of the semiconductor probing system.

11. The semiconductor probing system of claim 10, further comprising a supporter disposed on the second surface of the probe head, wherein the skewed cantilever end is affixed to the supporter by an epoxy resin.

12. The semiconductor probing system of claim 10, further comprising a transparent cover disposed on the second surface of the probe head, extending laterally out from the probe head, and substantially covering the underlying cantilever probe.

13. The semiconductor probing system of claim 10, wherein a shortest lateral distance between the cantilever probe and the vertical probe is fixed and the distance corresponds to the lateral distance between two testing pads of a patterned wafer being tested.

14. The semiconductor probing system of claim 13, wherein the distance between two testing pads of a patterned wafer comprises an integer multiple of the distance between two adjacent testing pads.

15. The semiconductor probing system of claim 10, wherein a shortest lateral distance between the cantilever probe and the vertical probe corresponds to the lateral distance between testing pads and an alignment mark of a patterned wafer being tested.

16. The semiconductor probing system of claim 10, wherein the vertical distance between the second surface of the probe head and the tip of the cantilever probe is equal to or greater than the vertical distance between the second surface of the probe head and the tip of the vertical probe.

17. The semiconductor probing system of claim 10, wherein the vertical probes are selected from the group consisting of a pin with a buckling section, a pin with a spring section, a pin with at least one slot, a POGO pin, and the combination thereof.

18. The semiconductor probing system of claim 10, wherein the probe head comprises an upper guiding plate having a plurality of upper guiding holes and a bottom guiding plate having a plurality of bottom guiding holes, wherein the plurality of vertical probes and the at least one cantilever probe are disposed between the upper guiding holes of the upper guiding plate and the bottom guiding holes of the bottom guiding plate.

* * * * *